United States Patent
Yagnamurthy et al.

(10) Patent No.: US 10,231,338 B2
(45) Date of Patent: Mar. 12, 2019

(54) METHODS OF FORMING TRENCHES IN PACKAGES STRUCTURES AND STRUCTURES FORMED THEREBY

(71) Applicant: INTEL CORPORATION, Santa Clara, CA (US)

(72) Inventors: Naga Sivakumar Yagnamurthy, Chandler, AZ (US); Huiyang Fei, Chandler, AZ (US); Pramod Malatkar, Chandler, AZ (US); Prasanna Raghavan, Chandler, AZ (US); Robert Nickerson, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 155 days.

(21) Appl. No.: 14/748,496

(22) Filed: Jun. 24, 2015

(65) Prior Publication Data

US 2016/0381800 A1    Dec. 29, 2016

(51) Int. Cl.
*H01L 23/28* (2006.01)
*H01L 23/538* (2006.01)
(Continued)

(52) U.S. Cl.
CPC ......... *H05K 1/181* (2013.01); *B29C 33/0033* (2013.01); *B29C 37/0025* (2013.01);
(Continued)

(58) Field of Classification Search
CPC ... H01L 2224/32145; H01L 2224/4824; H01L 24/11; H01L 24/04; H01L 23/5226; H01L 2224/73204; H01L 2924/181; H01L 2224/03; H01L 2225/06517; H01L 24/81; H01L 25/0657; H01L 2225/06513;
(Continued)

(56) References Cited

U.S. PATENT DOCUMENTS 6,504,242 B1    1/2003    Deppisch et al.
6,597,575 B1    7/2003    Matayabas, Jr. et al.
(Continued)

FOREIGN PATENT DOCUMENTS

JP    2013143570 A    7/2013
JP    2013225638 A    10/2013
(Continued)

OTHER PUBLICATIONS

De Bonis, Thomas et al., "Package Structure to Enhance Yield of TMI Interconnections", U.S. Appl. No. 14/198,479, filed Mar. 5, 2014, 30 pages.
(Continued)

*Primary Examiner* — Jasmine Clark
(74) *Attorney, Agent, or Firm* — Schwabe, Williamson & Wyatt, P.C.

(57) ABSTRACT

Methods of forming a package structures comprising a trench are described. An embodiment includes a first die disposed on a first substrate, and at least one interconnect structure disposed on a peripheral region of the first substrate. A molding compound is disposed on a portion of the first substrate and on the first die, wherein a trench opening is disposed in the molding compound that is located between the at least one interconnect structure and the first die.

23 Claims, 9 Drawing Sheets

(51) Int. Cl.

| | | |
|---|---|---|
| *H01L 25/065* | (2006.01) | |
| *H05K 1/18* | (2006.01) | |
| *H05K 1/11* | (2006.01) | |
| *B29C 70/84* | (2006.01) | |
| *B29C 70/70* | (2006.01) | |
| *B29C 70/88* | (2006.01) | |
| *B29C 37/00* | (2006.01) | |
| *B29C 33/00* | (2006.01) | |
| *B29C 69/00* | (2006.01) | |
| *G11C 11/401* | (2006.01) | |
| *H01L 23/48* | (2006.01) | |
| *H01L 23/498* | (2006.01) | |
| *H01L 25/10* | (2006.01) | |
| *B29K 63/00* | (2006.01) | |
| *B29L 31/34* | (2006.01) | |
| *G11C 5/04* | (2006.01) | |
| *H05K 1/14* | (2006.01) | |

(52) U.S. Cl.
CPC ............ *B29C 69/001* (2013.01); *B29C 70/70* (2013.01); *B29C 70/84* (2013.01); *B29C 70/882* (2013.01); *G11C 11/401* (2013.01); *H01L 23/48* (2013.01); *H01L 23/49811* (2013.01); *H01L 25/105* (2013.01); *H05K 1/111* (2013.01); *B29K 2063/00* (2013.01); *B29K 2995/0005* (2013.01); *B29L 2031/3481* (2013.01); *G11C 5/04* (2013.01); *H01L 23/49816* (2013.01); *H01L 23/49838* (2013.01); *H01L 2224/16225* (2013.01); *H01L 2924/15311* (2013.01); *H01L 2924/1815* (2013.01); *H05K 1/144* (2013.01); *H05K 2201/0379* (2013.01); *H05K 2201/09036* (2013.01); *H05K 2201/10159* (2013.01); *H05K 2203/041* (2013.01)

(58) Field of Classification Search
CPC ............ H01L 21/565; H01L 2225/1058; H01L 23/49827; H01L 24/97; H01L 24/16; H01L 23/3121; H01L 2224/32225; H01L 23/3128; H01L 2924/15311; H05K 1/181; H05K 1/111; H05K 2201/09036; H05K 2201/10159; B29C 70/84; B29C 37/0025; G11C 11/401
See application file for complete search history.

(56) References Cited

U.S. PATENT DOCUMENTS

| | | | |
|---|---|---|---|
| 6,723,627 | B1 | 4/2004 | Kariyazaki et al. |
| 6,974,723 | B2 | 12/2005 | Matayabas, Jr. et al. |
| 7,014,093 | B2 | 3/2006 | Houle et al. |
| 7,036,573 | B2 | 5/2006 | Koning et al. |
| 7,170,188 | B2 | 1/2007 | Matayabas, Jr. et al. |
| 7,252,877 | B2 | 8/2007 | Jayaraman et al. |
| 7,253,523 | B2 | 8/2007 | Dani et al. |
| 7,436,058 | B2 | 10/2008 | Hua et al. |
| 7,527,090 | B2 | 5/2009 | Dani et al. |
| 7,851,894 | B1 | 12/2010 | Scanlan |
| 8,162,203 | B1 | 4/2012 | Gruber et al. |
| 8,305,766 | B2 | 11/2012 | Park |
| 8,339,796 | B2 | 12/2012 | Lee et al. |
| 8,552,305 | B2 | 10/2013 | Park et al. |
| 8,671,564 | B2 | 3/2014 | Oh et al. |
| 8,692,391 | B2 | 4/2014 | Jeong et al. |
| 8,736,077 | B2 | 5/2014 | Kim et al. |
| 8,809,181 | B2 | 8/2014 | Sidhu et al. |
| 8,826,527 | B2 | 9/2014 | Park |
| 8,881,382 | B2 | 11/2014 | Lee et al. |
| 8,896,110 | B2 | 11/2014 | Hu et al. |
| 8,920,934 | B2 | 12/2014 | Jiang et al. |
| 8,942,004 | B2 | 1/2015 | Hong et al. |
| 8,981,549 | B2 | 3/2015 | Kim et al. |
| 9,237,647 | B2 * | 1/2016 | Yew .................... H05K 1/11 |
| 2001/0008160 | A1 | 7/2001 | Suzuki et al. |
| 2007/0090160 | A1 | 4/2007 | Masumoto |
| 2008/0078810 | A1 | 4/2008 | Kawamura et al. |
| 2009/0320281 | A1 | 12/2009 | Arana et al. |
| 2010/0224993 | A1 | 9/2010 | Swaminathan et al. |
| 2010/0288535 | A1 | 11/2010 | Hong et al. |
| 2010/0314755 | A1 | 12/2010 | Kang et al. |
| 2011/0061922 | A1 | 3/2011 | Lee et al. |
| 2011/0067901 | A1 | 3/2011 | Kim et al. |
| 2011/0076472 | A1 | 3/2011 | Kim et al. |
| 2011/0083891 | A1 | 4/2011 | We et al. |
| 2011/0083892 | A1 | 4/2011 | We et al. |
| 2011/0097856 | A1 | 4/2011 | Kim et al. |
| 2011/0127076 | A1 | 6/2011 | Kim et al. |
| 2011/0147668 | A1 | 6/2011 | Kim et al. |
| 2011/0156241 | A1 | 6/2011 | Hong et al. |
| 2011/0164391 | A1 | 7/2011 | Shin et al. |
| 2011/0194007 | A1 | 8/2011 | Kim et al. |
| 2011/0233747 | A1* | 9/2011 | Lee .................... H01L 23/31 257/686 |
| 2011/0240927 | A1 | 10/2011 | Kim et al. |
| 2012/0070939 | A1 | 3/2012 | Dunne et al. |
| 2012/0087098 | A1 | 4/2012 | Lee et al. |
| 2012/0119358 | A1 | 5/2012 | Oh |
| 2012/0127681 | A1 | 5/2012 | Ryu et al. |
| 2012/0153473 | A1 | 6/2012 | Lee |
| 2012/0160550 | A1 | 6/2012 | Jeong et al. |
| 2012/0161323 | A1 | 6/2012 | Kim et al. |
| 2012/0319274 | A1 | 12/2012 | Tanaka et al. |
| 2013/0178016 | A1 | 7/2013 | Yim et al. |
| 2013/0187288 | A1* | 7/2013 | Hong .................... H01L 25/105 257/774 |
| 2013/0270685 | A1 | 10/2013 | Yim et al. |
| 2013/0341379 | A1 | 12/2013 | Sidhu et al. |
| 2014/0027885 | A1 | 1/2014 | Kawase et al. |
| 2014/0084461 | A1 | 3/2014 | Sidhu et al. |
| 2014/0124925 | A1 | 5/2014 | Sidhu et al. |
| 2014/0138826 | A1 | 5/2014 | Kumar |
| 2014/0151096 | A1 | 6/2014 | Jiang et al. |
| 2014/0170815 | A1 | 6/2014 | Jeong et al. |
| 2014/0175160 | A1 | 6/2014 | Sidhu et al. |
| 2014/0175644 | A1 | 6/2014 | Srinivasan et al. |
| 2014/0264910 | A1 | 9/2014 | Razdan et al. |
| 2014/0268534 | A1 | 9/2014 | Sidhu et al. |
| 2014/0335656 | A1* | 11/2014 | Oh ..................... H01L 21/561 438/109 |
| 2014/0353821 | A1 | 12/2014 | Yu |
| 2015/0041979 | A1 | 2/2015 | Goudarzi |
| 2015/0070865 | A1 | 3/2015 | Yew et al. |
| 2015/0162313 | A1 | 6/2015 | Razdan et al. |

FOREIGN PATENT DOCUMENTS

| | | |
|---|---|---|
| KR | 20090083129 A | 8/2009 |
| KR | 20120042240 A | 5/2012 |

OTHER PUBLICATIONS

Notice of Allowance mailed Nov. 21, 2016 for U.S. Appl. No. 14/198,479, 14 pages.

Non-Final Office Action mailed Nov. 24, 2015 for U.S. Appl. No. 14/198,479, 13 pages.

Final Office Action mailed May 18, 2016 for U.S Appl. No. 14/198,479, 17 pages.

International Search Report and Written Opinion mailed Aug. 24, 2016 for International Application No. PCT/US2016/033957, 15 pages.

Non-Final Office Action dated Oct. 20, 2017 for U.S. Appl. No. 15/478,064, 8 pages.

(56) References Cited

OTHER PUBLICATIONS

Notice of Allowance dated Apr. 20, 2018 for U.S. Appl. No. 15/478,064, 8 pages.

* cited by examiner

METHODS OF FORMING TRENCHES IN PACKAGES STRUCTURES AND STRUCTURES FORMED THEREBY

BACKGROUND OF THE INVENTION

As packing technology moves towards increasing miniaturization, such techniques as forming through mold interconnect (TMI) structures may be employed, wherein the integration of two separately packaged die to form a larger, overall package may be achieved. For example, in package on package (PoP) structures, a first packaged die may be coupled with a second packaged die by the use of solder ball connections between the two packaged die, which may be located within a TMI opening.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic package structures, such as package devices, are presented. Those methods/structures may include providing a substrate with a first die disposed thereon, wherein a trench may be formed between the first die and a through mold interconnect (TMI) structure. The trench serves to prevent the flow of a flux material that may be disposed within the TMI structure.

FIGS. 1a-1j depict cross sectional views of embodiments of forming packaged structures comprising trench openings.

Figure 1A:
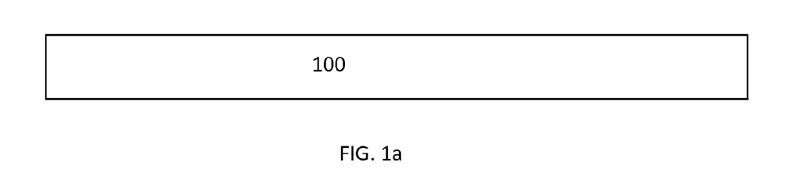
FIGS. 1a-1j represent cross sectional views of package structures according to embodiments.
Figure 1B:
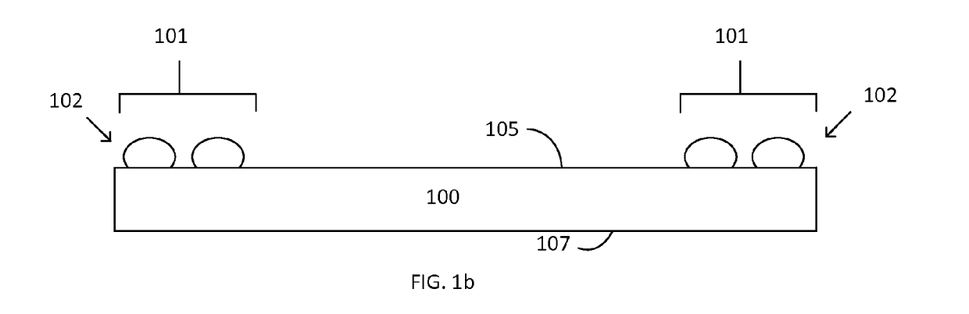
Figure 1C:
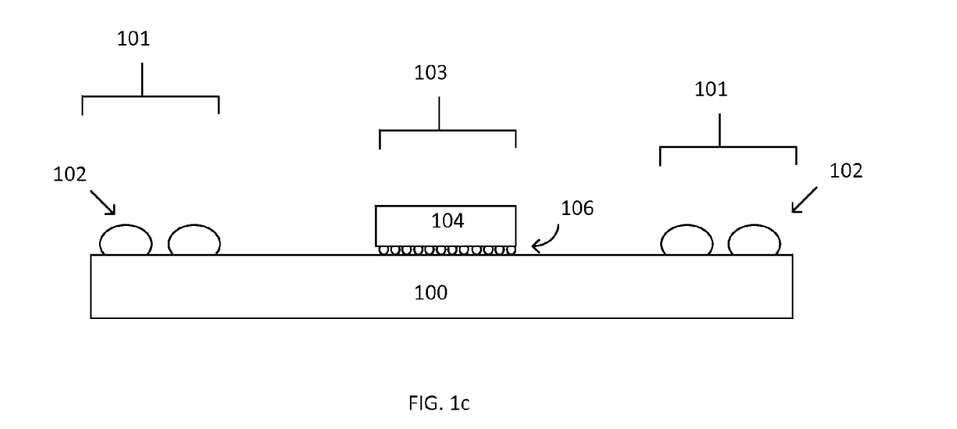

In FIGS. 1a-1b, at least one interconnect structure 102, which may comprise at least one solder ball 102, for example, may be placed/formed on a first substrate 100. The first substrate 100 may comprise any type of substrate material, such as organic or inorganic substrate materials. In an embodiment, the substrate may comprise various circuitry elements, such as signaling circuitry that may be carried by traces within the first substrate 100. In an embodiment, the first substrate 100 may comprise a first side 105 and a second side 107, and may comprise a first package substrate 100. In an embodiment, the first substrate 100 may be formed of any standard printed circuited board (PCB) material, such as alternating layers of a patterned copper conductors (traces) and a variety of insulators such as an epoxy and fillers such as glass, silica, or other materials In an embodiment, the at least one interconnect structure 102 may comprise any type of interconnect structure 102, such as ball grid array (BGA) interconnects and land grid array (LGA) interconnects, for example. In an embodiment, the interconnect structures 102 may be located proximate to an edge region 101/periphery of the first substrate 100. In an embodiment, a first die 104 may be placed on the first substrate 100, and may be located adjacent the interconnect structures 102 (FIG. 1c). In an embodiment, the first die 104 may be place/located in a center region 103 of the substrate 100. In an embodiment, the first die 104 may comprise a system on a chip (SOC), and may comprise in embodiments any appropriate integrated circuit device including but not limited to a microprocessor (single or multi-core), a memory device, a chipset, a graphics device, an application specific integrated circuit, a central processing unit (CPU) or the like.

Figure 1D:
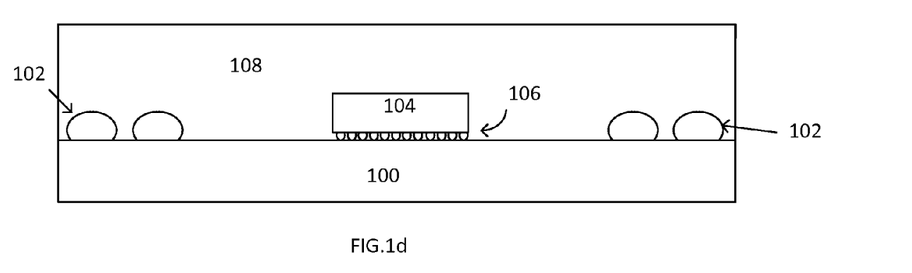

The first die 104 may be communicatively coupled with the first substrate 100 by a plurality of die/conductive structures 106, such as by a plurality of solder balls, which may comprise ball grid array solder balls for example. In an embodiment, a molding compound 108 may be formed/placed over the first substrate 100, and may surround the first die 104 and the interconnect structures 102 (FIG. 1d). In an embodiment, the first die 104 may be fully embedded in the molding compound 108. In other embodiments, the first die 104 may be at least partially embedded in the molding compound 108. In an embodiment, the molding compound 108 may comprise such materials as epoxy materials.

Figure 1E:
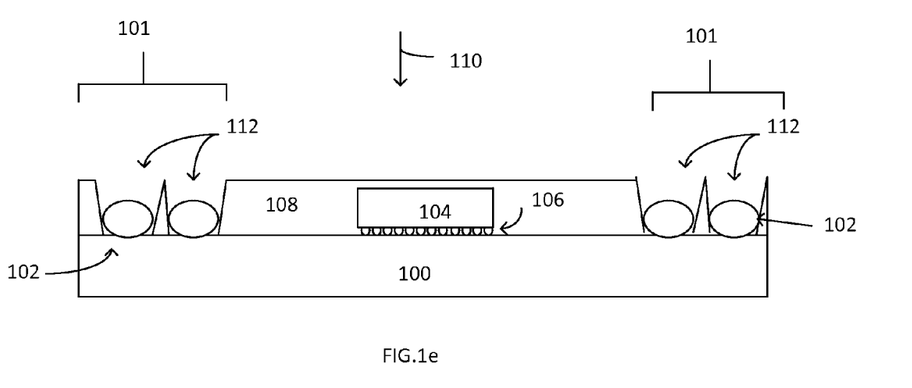

In an embodiment, openings 112 may be formed in the molding compound 108, which may expose the solder connections 102 on the substrate 100 (FIG. 1e). The openings 112 may be formed by using a process 110, such as a laser removal process. Other types of processes may be utilized in order to form the openings 112, which may comprise through mold interconnect (TMI) openings/vias, in an embodiment. In FIG. 1e, the openings are depicted as comprising angular sidewalls, but other embodiments of the openings 112 may include substantially straight sidewalls, or may include U-shaped openings or any other suitable profiles. In an embodiment, two openings/vias on each edge region 101 of the first substrate 100 may be present/formed, however in other embodiments there may be one opening 112 on each side/edge region 101 of the first substrate 100, and in other embodiments there may be more than two openings 112 in the edge regions 101 of the first substrate 100.

Figure 1F:
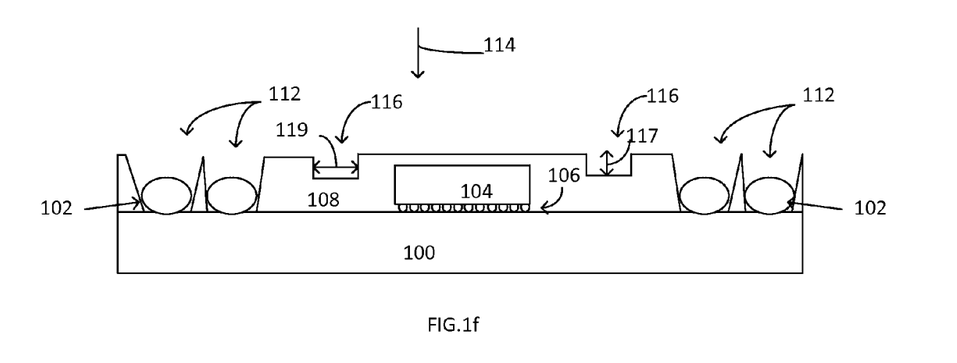
Figure 1G:
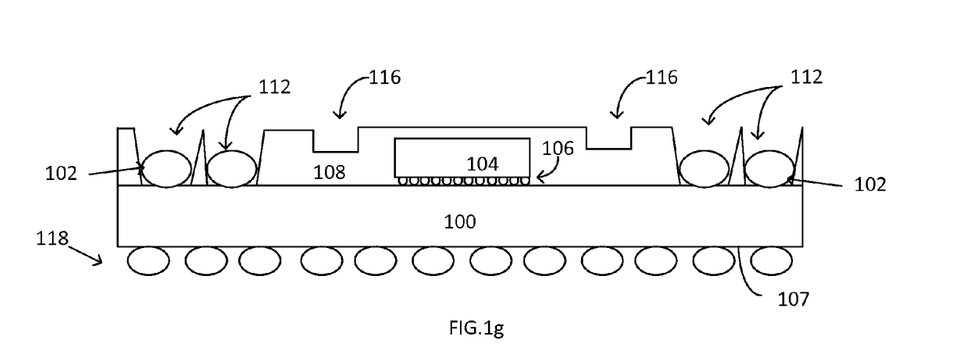

In an embodiment, at least one trench opening 116 may be formed in a portion of the molding compound 108 disposed between the first die 104 and the interconnect structures 102 (FIG. 1f). The at least one trench opening 116 may be formed with a process 114, such as a laser process, for example, wherein an opening may be formed in the molding compound 108. In an embodiment, the at least one trench opening 116 may be formed at the same process step as the mold openings 112 process step. The at least one trench opening 116 may comprise a depth/height 117 of about 10 µm (microns) to about 300 µm and a width 119 of about 10 µm to about 1500 µm, in some embodiments, but in other embodiments may vary according to the particular application. In an embodiment, there may be at least one trench 116 located adjacent the first die 104.

Figure 2A:
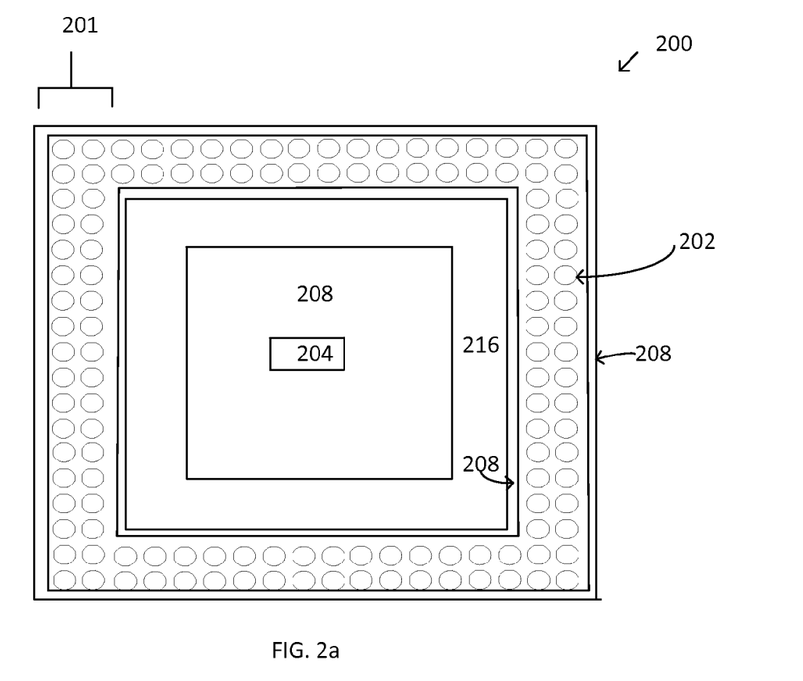
FIGS. 2a-2d represent top plan views of package structures according to embodiments.
Figure 2B:
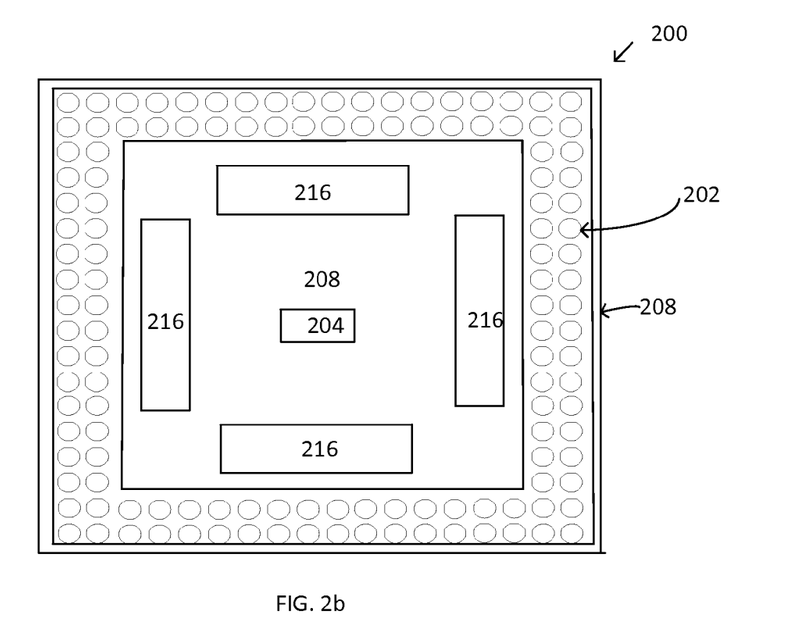
Figure 2C:
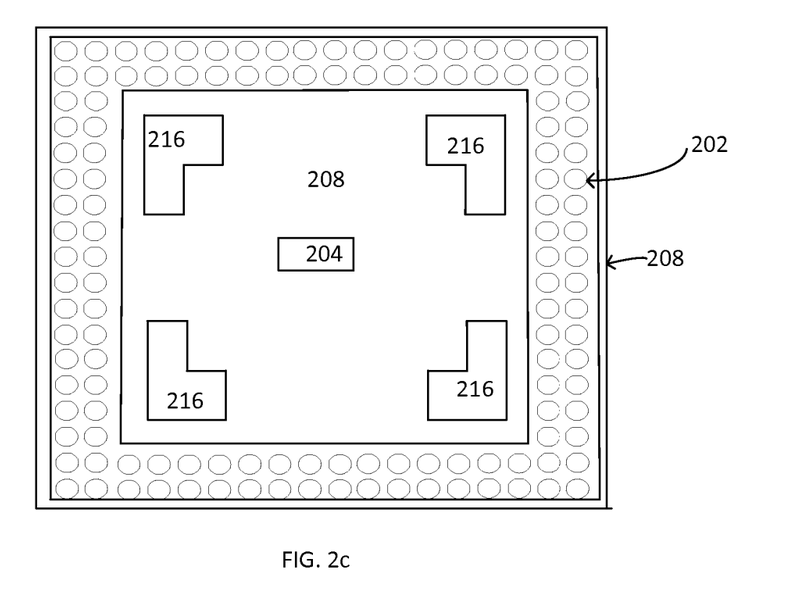

Referring to FIGS. 2a-2c (top plan view of a portion of a first package substrate 200), a trench 216 may comprise a continuous trench 216 in an embodiment (FIG. 2a), wherein the trench 216 is formed in a continuous rectangular shape, and surrounds a die 204, such as a first die 204. The continuous trench 216 is located between the interconnect structures 202 (located in an edge region 201 of the substrate) and the first die 204. The trench 216 comprises an opening in the molding compound 208.

Figure 2D:
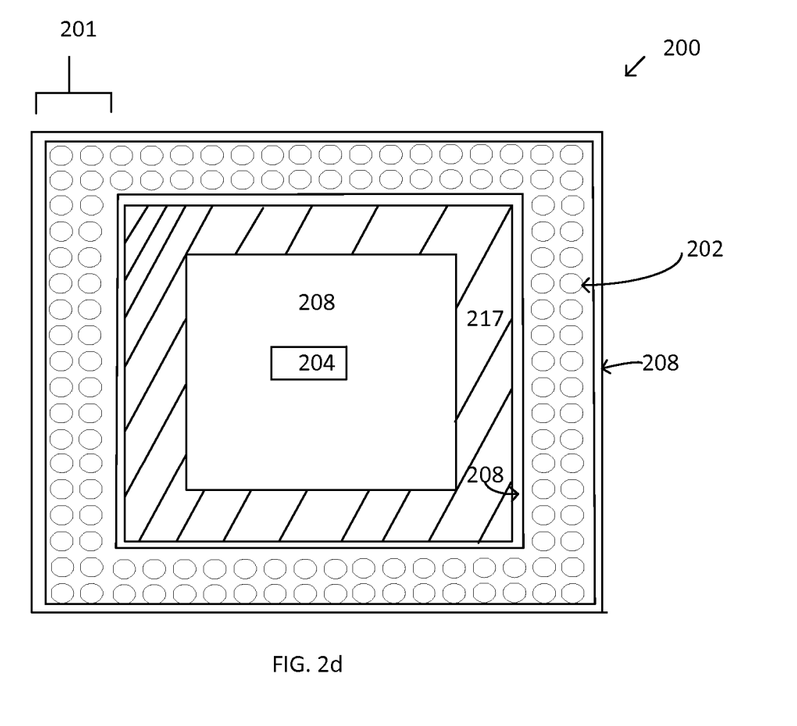

In another embodiment, the trench 216 may be formed such that it may comprise a discontinuous rectangular shape, wherein the trench portions 216 may comprise discontinuities between adjacent rectangular trench portions 216, as depicted in FIG. 2b. In an embodiment, the molding compound 208 comprises a trench height that is lower in the trench areas than in the adjacent non-trench areas between the discontinuous trench areas/portions 216. In another embodiment, (FIG. 2c) the trench 216 may be formed in an L-shape in the corner regions of the first substrate 200. The L-shaped trench portions 216 are disposed between the first die 204 and the solder connections 202, and comprise a lower height than the adjacent non-trench L-shaped portions of the mold compound 208. In another embodiment, the at least one trench opening 116 may further comprise a stiffener material 217 (FIG. 2d). For example, a stiffener 217, such as a stiffener 217 comprising a metal material, may be placed/formed within the at least one trench opening 216. In an embodiment, the stiffener material 217 may comprise a copper and/or a stainless steel material, for example. In some cases, the stiffener 217 may serve to control/reduce warpage in the package structures of the embodiments herein. In an embodiment, the stiffener may be placed within the at least one trench 216 by using a glue, such as an epoxy material, for example.

Figure 1H:
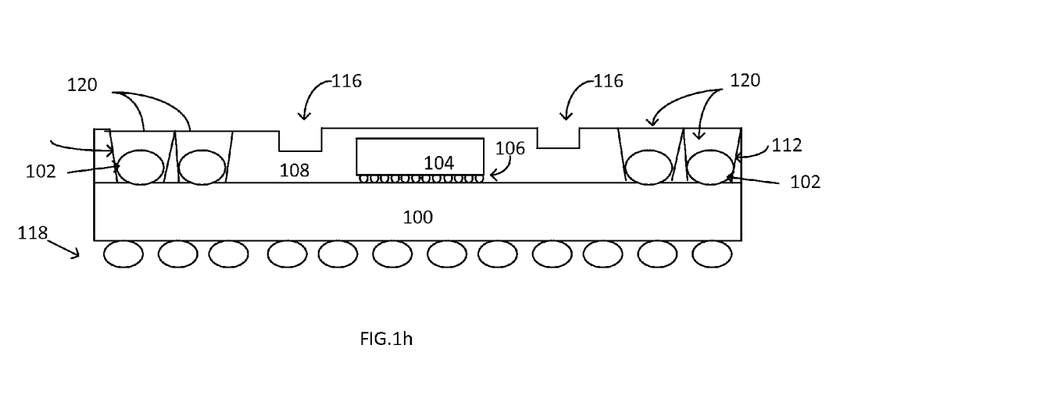
Figure 1I:
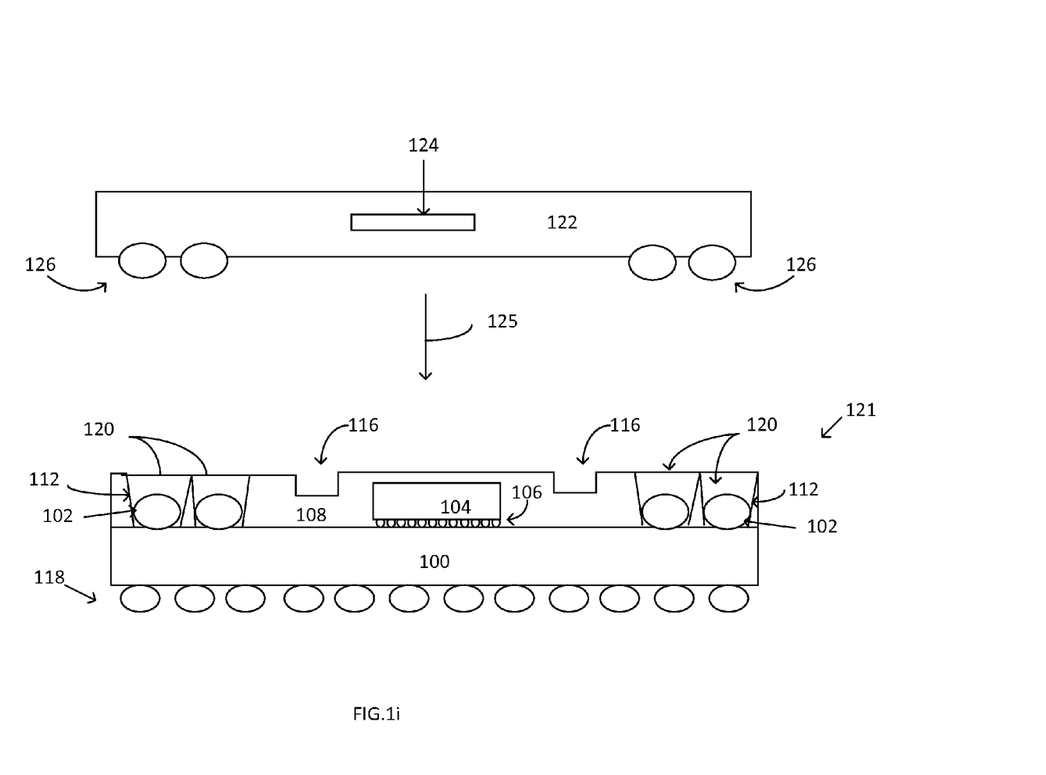

Referring back to FIG. 1g, a plurality of solder balls 118 may be placed/formed on the second side 107 of the first substrate 100. A flux material 120 may be placed/formed in the openings 212, and may cover/coat the interconnect structures 102 (FIG. 1h). In an embodiment, the flux material 120 may substantially fill the opening 212, but in other embodiments the flux material 120 may only partially fill the openings 212. In FIGS. 1h-1i, a second substrate 122, may be coupled to the first substrate 100. In an embodiment, the second substrate 122 may comprise a second die 124, and at least one solder ball 126. In an embodiment, the second die may comprise a memory die.

Figure 1J:
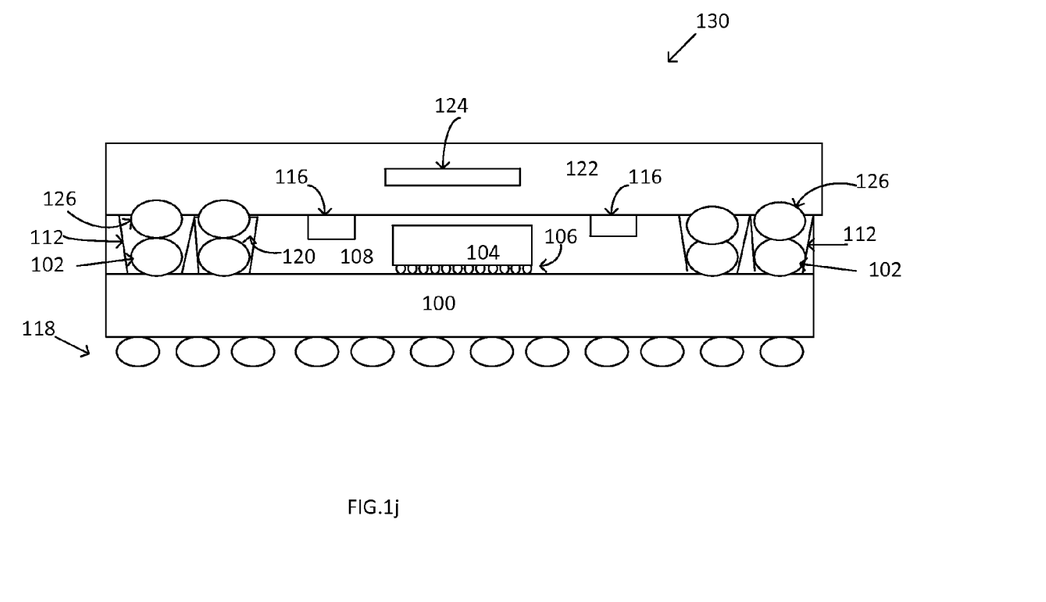

An assembly process 125 may join/couple the first substrate 100 to the second substrate 122, to form the stacked die structure 130 (FIG. 1j). A TMI joint, such as a TMI solder joint, may be formed by the joining of the solder ball from the second substrate 122 and the at least one interconnect structure 102 of the first substrate 100. During subsequent processing of the stacked die structure 130, (which may comprise a PoP, or a 3D stacked package structure in embodiments), such as during reflow processing of the TMI solder joint, for example, the stacked package structure 130 may undergo temperature processing of between about 150 degrees Celsius to about 260 degrees Celsius, for example.

The trench opening 116 may serve to prevent the flow of flux, such as the flux 120, from the openings 112 to the package surface, such as towards a region near the first die 104. The trench opening 116 may additionally be utilized to alter the package warpage at both room temperature and at higher temperatures. The trench openings 116 are capable of preventing deformation/warpage of the stacked package structure 130, by preventing a flow of the flux material by preventing/breaking the capillary action induced flow of the flux material.

Figure 3:
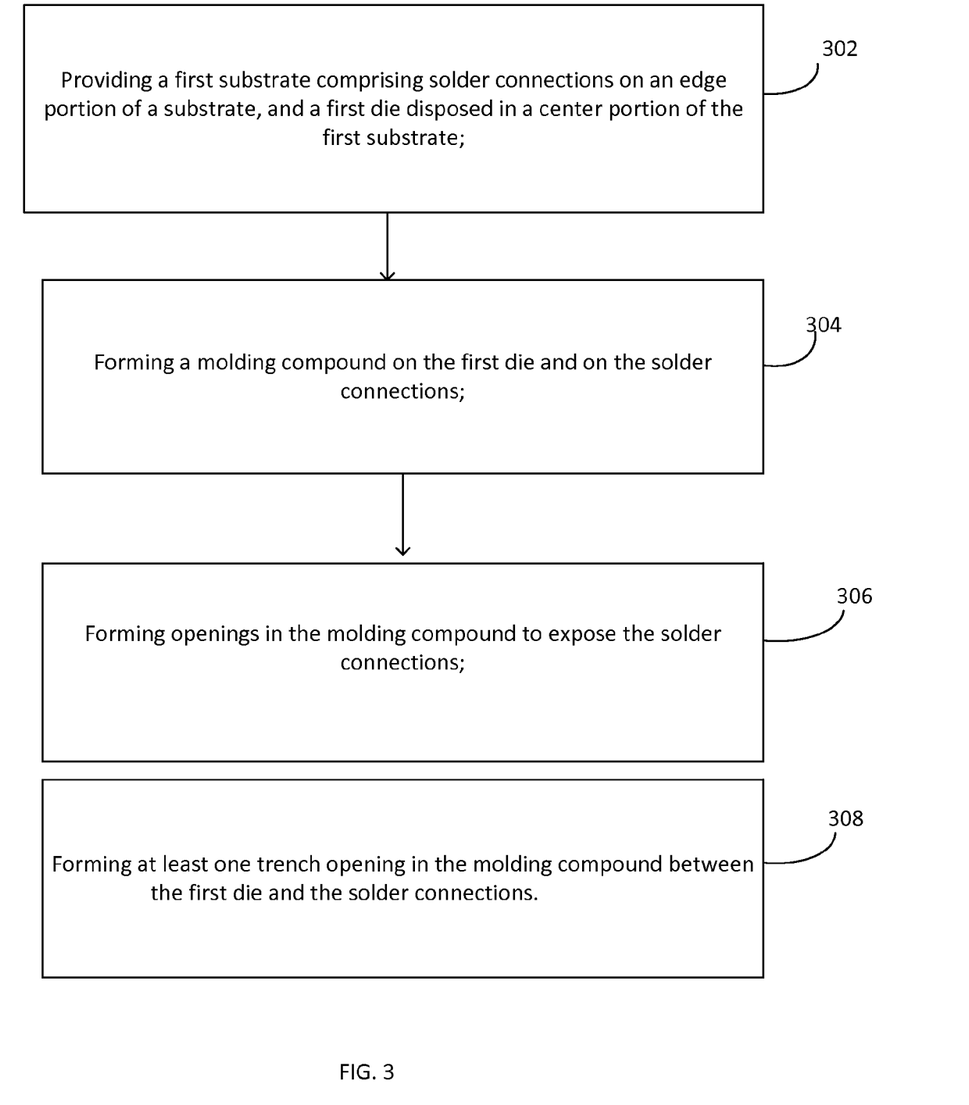
FIG. 3 represents a flow chart of a method according to embodiments.

FIG. 3 depicts a flow chart of a method of forming a package structure comprising a trench. At step 302, a substrate is provided comprising solder connections on an edge portion of a first substrate, and a first die in a center portion of the first substrate. At step 304, a molding compound is formed on the first die and on the solder connections. At step 306, openings, which may comprise TMI vias, in an embodiment, are formed in the molding compound to expose the solder connections. At step 308 at least one trench is formed in the molding compound between the first die and the solder connections. The trench openings are capable of breaking a capillary action of a flow of flux that may occur, from the TMI vias towards the first die, in an embodiment. In an embodiment, the trench openings may act as a reservoir/dam to collect all the preflux from flowing inside/onto the die region.

In an embodiment, the package structures of the embodiments herein may be coupled with any suitable type of structures capable of providing electrical communications between a microelectronic device, such as a die, disposed in the package structures herein, and a next-level component to which the package structures may be coupled (e.g., a circuit board).

The package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. The structures/devices described in the various figures herein may comprise portions of a silicon logic die or a memory die, for example, or any type of suitable microelectronic device/die. In some embodiments the devices may further comprise a plurality of dies, which may be stacked upon one another, depending upon the particular embodiment. In an embodiment, the die(s) may be partially or fully embedded in a package structure of the embodiments.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra mobilePC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

The embodiments herein include realization of package structures, such as 3D package structures, that display decreased warpage and increased throughput and yield.

Figure 4:
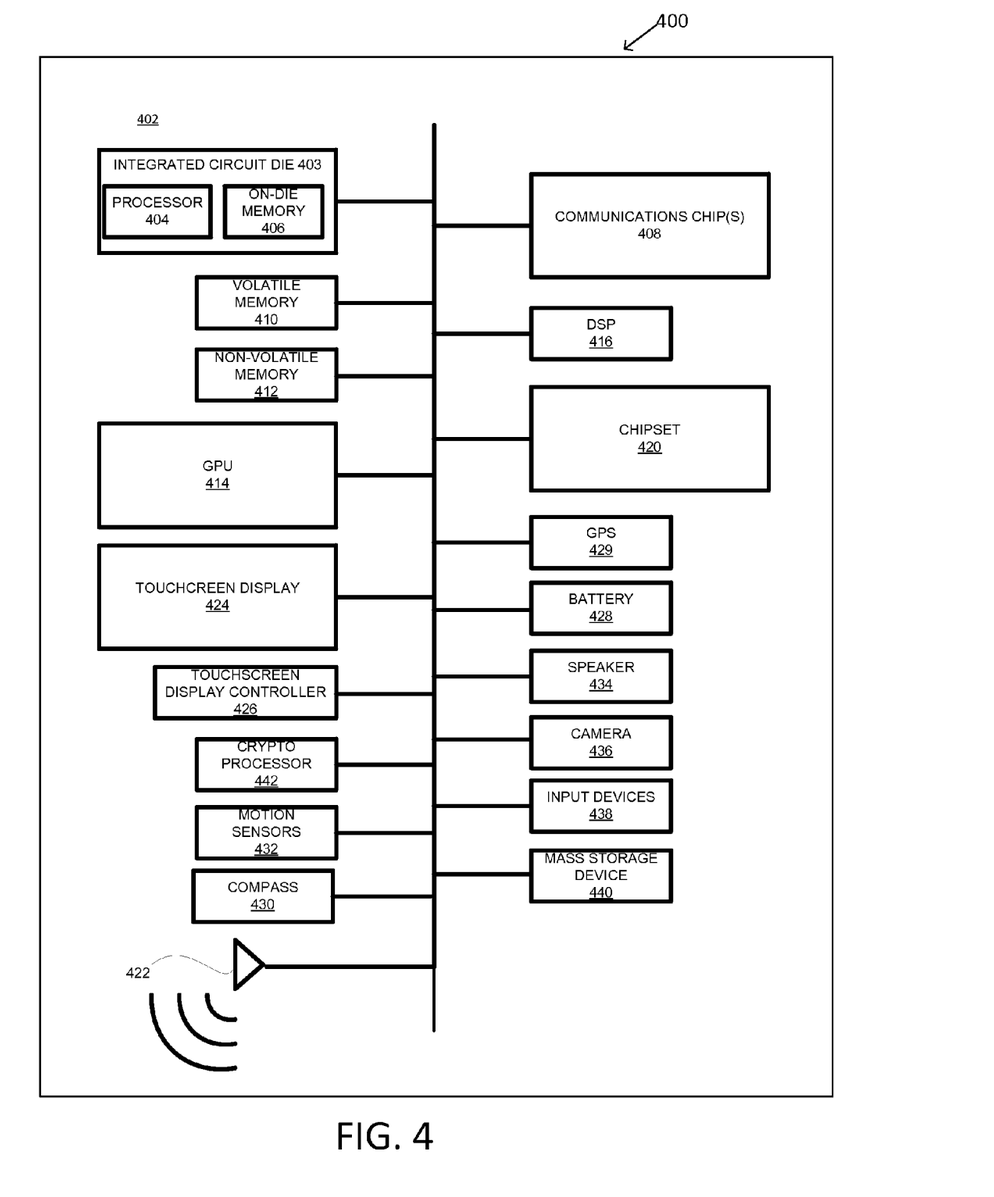
FIG. 4 represents a schematic of a system according to embodiments.

FIG. 4 is a schematic of a computing device 400 according to an embodiment. The computing device 400 houses a board 402, such as a motherboard 402 for example. The board 402 may include a number of components, including but not limited to a processor 404, and an on-die memory 406, that may be communicatively coupled with an integrated circuit die 403, and at least one communication chip 408. The processor 404 may be physically and electrically coupled to the board 402. In some implementations the at least one communication chip 408 may be physically and electrically coupled to the board 402. In further implementations, the communication chip 406 is part of the processor 404.

Depending on its applications, computing device 400 may include other components that may or may not be physically and electrically coupled to the board 402, and may or may not be communicatively coupled to each other. These other components include, but are not limited to, volatile memory (e.g., DRAM) 410, non-volatile memory (e.g., ROM) 412, flash memory (not shown), a graphics processor unit (GPU) 414, a digital signal processor (DSP) 416, a crypto processor 442, a chipset 420, an antenna 422, a display 424 such as a touchscreen display, a touchscreen controller 426, a battery 428, an audio codec (not shown), a video codec (not shown), a global positioning system (GPS) device 429, a compass 430, accelerometer, a gyroscope and other inertial sensors 432, a speaker 434, a camera 436, and a mass storage device (such as hard disk drive, or solid state drive) 440, compact disk (CD) (not shown), digital versatile disk (DVD) (not shown), and so forth). These components may be connected to the system board 402, mounted to the system board, or combined with any of the other components.

The communication chip 408 enables wireless and/or wired communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 400 may include a plurality of communication chips 408. For instance, a first communication chip 408 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

In various implementations, the computing device 400 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
a first die disposed on a first substrate;
at least one interconnect structure disposed on an edge region of the first substrate;
a molding compound disposed on a portion of the first substrate and on the first die;
an opening in the molding compound located in the edge region of the first substrate, wherein the at least one interconnect structure is disposed therein; and
a trench opening in the molding compound, wherein the trench opening is located between the at least one interconnect structure and the first die, wherein the trench opening includes a metal stiffener, wherein an interconnect structure of a second substrate is coupled to the at least one interconnect structure disposed on the first substrate, and wherein the second substrate is in contact with the molding compound.

2. The structure of claim 1, wherein the opening in the molding compound located in the edge region of the first substrate comprises a through mold interconnect (TMI) via.

3. The structure of claim 2, wherein the coupling between the at least one interconnect structure disposed on the first substrate and the interconnect structure disposed on the second substrate comprises a TMI solder joint structure.

4. The structure of claim 1, wherein the trench opening is to prevent flow of a flux material across the first die.

5. The structure of claim 2, wherein a second die disposed on the second substrate comprises a memory, and wherein the first die comprises a system on a chip.

6. The structure of claim 1, wherein the trench opening comprises one of a continuous shape, a discontinuous shape and an L shape.

7. The structure of claim 1, wherein the package structure comprises a package on package (PoP) structure.

8. A microelectronic package structure comprising:
a board;
a package structure coupled to the board, wherein the package structure comprises:
a first die disposed on a first substrate;
a molding compound disposed on a portion of the first substrate and on the first die, wherein the first die is at least partially embedded in the molding compound;
a trench opening in the molding compound, wherein the trench opening is located between a TMI via disposed on the first substrate and the first die, wherein the trench opening includes a metal stiffener;

a second substrate coupled with the first substrate;
at least one interconnect structure disposed within the TMI via on the first substrate; and
a flux material disposed on a portion of the at least one interconnect structure, wherein a portion of the flux material is also in the trench opening.

9. The structure of claim 8, wherein the at least one interconnect structure that is disposed within the TMI via on the first substrate is electrically and physically coupled with an interconnect structure disposed on the second substrate.

10. The structure of claim 8, wherein the first die is selected from a group consisting of a central processing unit (CPU) die, a logic die, and a system on chip (SOC).

11. The structure of claim 8, wherein the trench opening comprises a height of about 10 μm to about 300 μm.

12. The structure of claim 8, wherein the trench opening is to prevent the flux material from flowing across a top surface of the molding compound.

13. The structure of claim 8, further comprising a system comprising:
a communication chip communicatively coupled to the package structure; and
a DRAM communicatively coupled to the communication chip.

14. The structure of claim 8, wherein the package structure comprises a PoP package structure.

15. The structure of claim 8, wherein the package structure comprises a 3D stackable package structure.

16. A method of forming a microelectronic package structure, comprising:
placing a first die on a center portion of a first substrate, and placing at least one solder ball on an edge portion of the first substrate;
forming a molding compound on a portion the first substrate and on the first die;
forming a through mold via opening in the molding compound, wherein the through mold via opening exposes the at least one solder ball;
forming a trench opening in the molding compound, wherein the trench opening is formed between the through mold via opening and the first die; and
placing a metal stiffener in the trench.

17. The method of claim 16, further comprising coupling a second substrate to the first substrate, wherein an interconnect structure disposed on the second substrate is coupled with the at least one solder ball disposed within the through mold via opening on the first substrate.

18. The method of claim 16, wherein the trench opening is to prevent flow of a flux material that is disposed within the through mold via opening.

19. The method of claim 17, wherein the first die is selected from a group consisting of a central processing unit (CPU) die, a logic die, and a SOC, and wherein the second substrate comprises a second die, wherein the second die comprises a memory die.

20. The method of claim 16, wherein the trench opening comprises a height of about 10 μm to about 300 μm.

21. The method of claim 16, wherein the trench opening is formed to comprise one of a continuous shape, a discontinuous shape and an L shape.

22. The method of claim 16, wherein the package structure comprises a 3D stackable package structure.

23. The method of claim 16, wherein placing the metal stiffener in the trench includes gluing the metal stiffener in the trench.

* * * * *

UNITED STATES PATENT AND TRADEMARK OFFICE
CERTIFICATE OF CORRECTION

| | |
|---|---|
| PATENT NO. | : 10,231,338 B2 |
| APPLICATION NO. | : 14/748496 |
| DATED | : March 12, 2019 |
| INVENTOR(S) | : Naga Sivakumar Yagnamurthy et al. |

Page 1 of 1

It is certified that error appears in the above-identified patent and that said Letters Patent is hereby corrected as shown below:

In the Claims

Column 8
Line 1, Claim 16 "... portion the" should read -- ... portion of the --

Signed and Sealed this
Third Day of September, 2019

Andrei Iancu
*Director of the United States Patent and Trademark Office*